US006271678B1

(12) United States Patent
Sochoux

(10) Patent No.: US 6,271,678 B1
(45) Date of Patent: Aug. 7, 2001

(54) TRANSMISSION LINE TERMINATOR FOR SIGNAL INTEGRITY AND EMI CONTROL

(75) Inventor: Philippe Sochoux, Sunnyvale, CA (US)

(73) Assignee: Cisco Technology Inc., San Jose, CA (US)

( * ) Notice: Subject to any disclaimer, the term of this patent is extended or adjusted under 35 U.S.C. 154(b) by 0 days.

(21) Appl. No.: 09/340,999

(22) Filed: Jun. 28, 1999

(51) Int. Cl.[7] .................................................. H03K 19/092
(52) U.S. Cl. .................................................. 326/30; 333/182
(58) Field of Search ................................ 326/30; 333/182

(56) References Cited

U.S. PATENT DOCUMENTS 4,622,527 * 11/1986 Carlson ................................. 333/182
4,638,272    1/1987 Ive ........................................ 333/236
4,677,396    6/1987 Cruz et al. ............................ 331/117
4,760,355 *  7/1988 Dash et al. ............................. 333/12
5,095,296    3/1992 Parker .................................... 336/92
5,654,507 *  8/1997 Hicks et al. ......................... 73/204.14
6,020,562 *  2/2000 Burns et al. .......................... 174/261

* cited by examiner

Primary Examiner—Trong Phan
Assistant Examiner—M. Tran
(74) Attorney, Agent, or Firm—Sheridan Ross

(57) ABSTRACT

A ferrite bead is placed in series with a terminating resistor on a transmission line such as a clock transmission line. In lower frequency ranges where the ferrite bead is substantially not effective, the transmission line will be effectively terminated by the resistor. In higher frequency ranges where the resistor is substantially no longer effective, the transmission line will be terminated by the ferrite bead. In one aspect, the resistor and ferrite bead are provided in a single surface mount package.

20 Claims, 3 Drawing Sheets

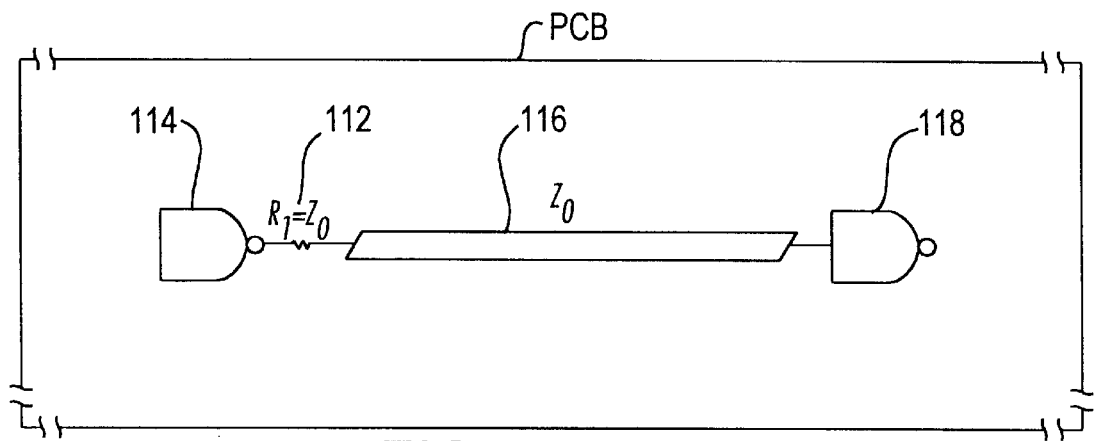
FIG. 1 - *Prior Art*
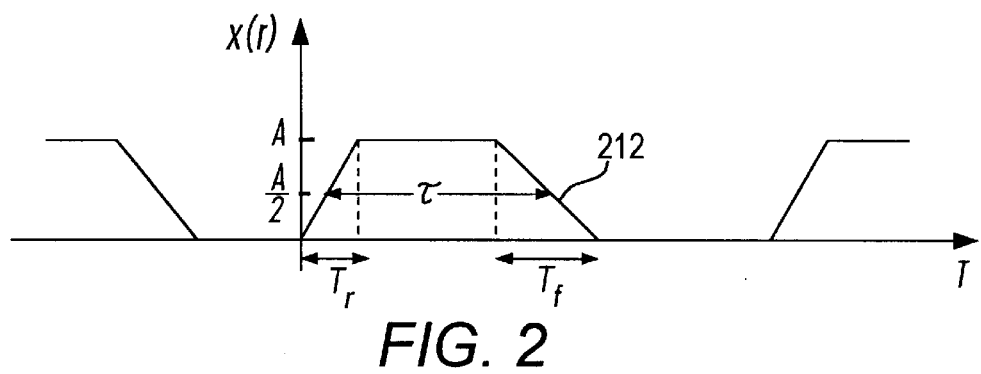
FIG. 2
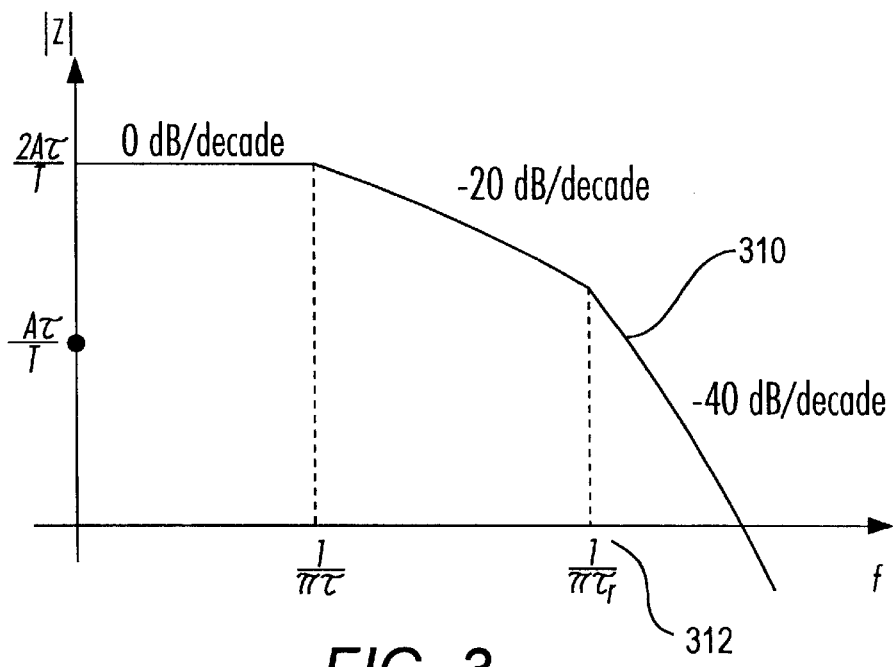
FIG. 3

FIG. 4 - Prior Art
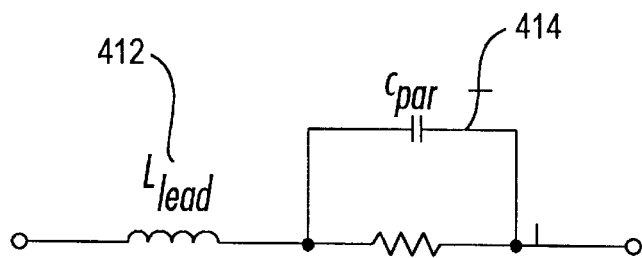
FIG. 5A
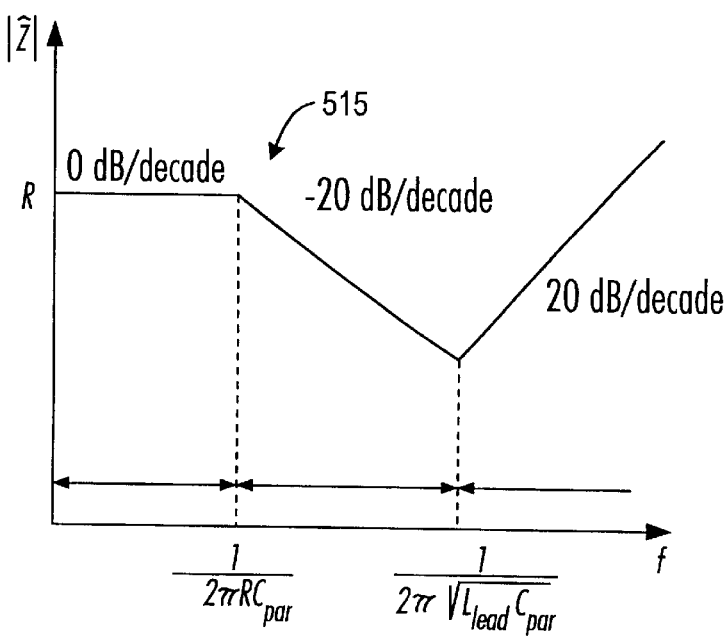
FIG. 5B
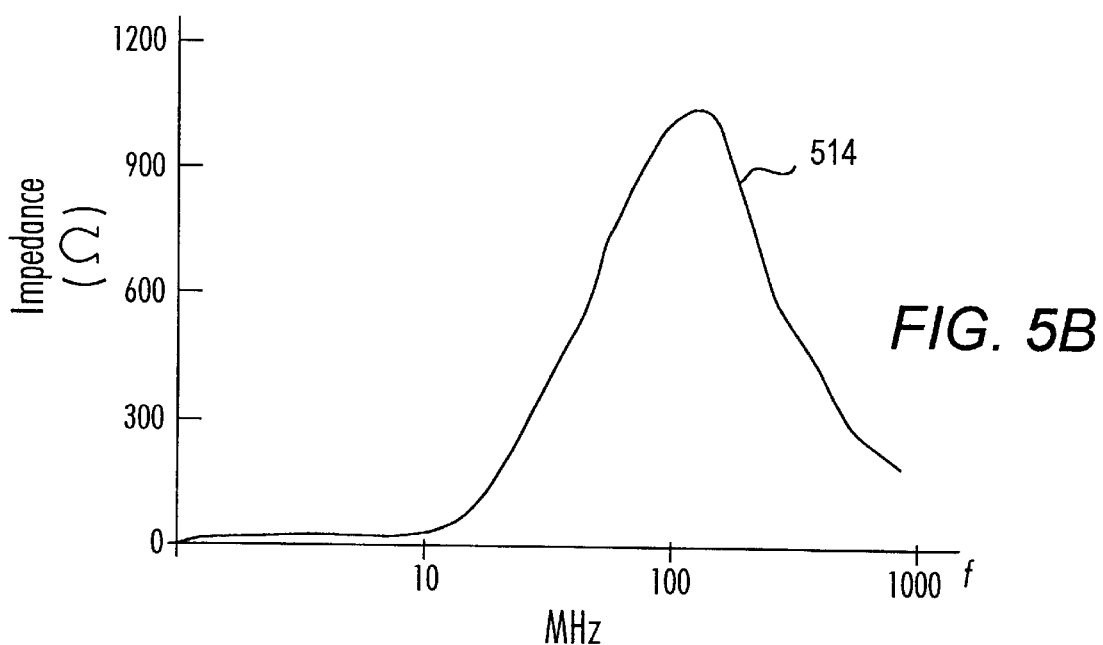

FIG. 6A
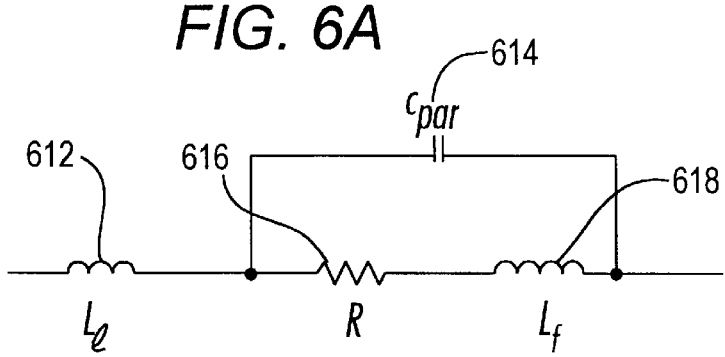
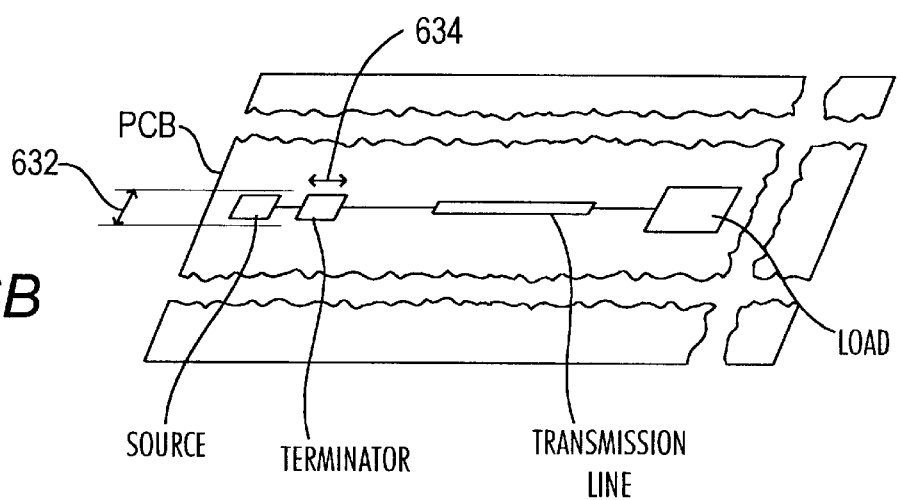
FIG. 6B
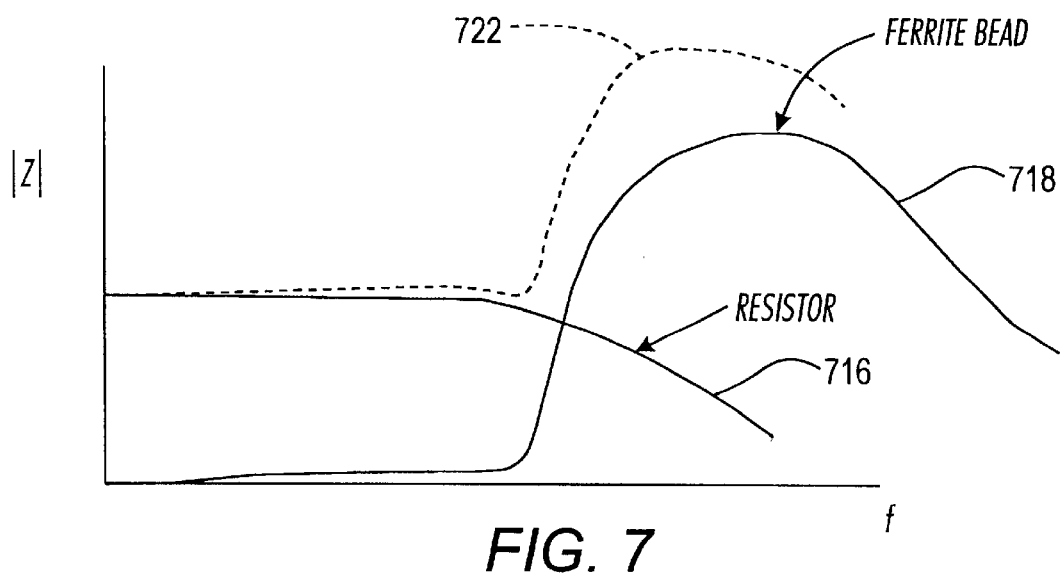
FIG. 7

TRANSMISSION LINE TERMINATOR FOR SIGNAL INTEGRITY AND EMI CONTROL

FIELD OF THE INVENTION

The present invention is related to a component useable for terminating transmission lines so as to control EMI while maintaining signal integrity and in particular to a component which combines a ferrite bead with resistance, preferably in a surface mount package.

BACKGROUND OF THE INVENTION

Many electronic devices are advantageously configured to reduce or substantially eliminate electromagnetic radiation which can potentially cause interference, so called electromagnetic interference (EMI). Examples of such electronic devices include computers, network devices such as routers, bridges and the like. A major source of electromagnetic interference is signal or data transmission lines which, depending on how the lines are terminated, can effectively operate as antenna, transmitting electromagnetic signals which result in interference. Typically, the transmission lines are used for carrying signals which, for proper operation of the electronic device, must be configured to avoid distorting or changing the waveshape percent of the signal and must, in general, substantially maintain signal integrity. Accordingly, it would be useful to provide a termination device for transmission lines which is configurable to simultaneously reduce or eliminate EMI and to maintain signal integrity. In particular, resistors are commonly used as transmission line terminators, but may not be completely satisfactory, especially when both signal integrity and reduction of EMI are important. Accordingly it would be useful to improve on resistors, as transmission line terminators.

One type of transmission line commonly found in computers and other electronic devices, and believed to be responsible for a major portion of EMI are clock signal lines. Accordingly, it would be advantageous to provide a device for terminating clock signal lines which both reduces or eliminates EMI and maintains the waveshape or otherwise maintains signal integrity of clock signals.

Typically, transmission line terminators will be provided on one or more printed circuit boards (PCBs) of an electronic device. In general, many electronic devices are designed to be as small as feasible so that the circuit boards therein typically cannot be configured with additional components which are large in size and/or numerous. Accordingly, it would be useful to provide terminators for transmission lines which require relatively little space on PCBs. Preferably, the terminator components are configured so as to be relatively low in cost and relatively easy to manufacture and assemble on the PCB.

SUMMARY OF THE INVENTION

The present invention provides a terminator device which effectively reduces or eliminates EMI from a transmission line while substantially maintaining signal integrity. In one aspect, the invention is an improvement over resistors which, while effectively terminating series-terminated transmission lines in many situations, typically do not properly handle the higher frequency contents of many waveforms (e.g. typical clock signal waveforms). In this context, higher frequency content can include frequency content starting at about the "knee" frequency, $1/(\pi\tau_r)$.

According to one aspect, the termination device includes a ferrite bead combined with a resistance in such a way that the device (or the equivalent circuit to the device) provides such resistance in series with the ferrite bead. Adding ferrite material (e.g. inside a surface-mount resistor package) will attenuate higher-frequency contents before they can propagated down the transmission line, thus reducing EMI. The resistance is selected, in light of the characteristics of the transmission line and the signals it will carry, to provide substantially constant ("flat") frequency response in lower frequency ranges while the ferrite bead presents a large impedance at higher frequencies. A substantially flat frequency response in lower frequencies assures signal integrity and acts, in combination with the high frequency impedance from the ferrite beads, to effectively reduce or eliminate EMI, while preserving signal integrity. Preferably, the values of the resitance and ferrite are selected such that the impedence created by the ferrite becomes relatively significant at and beyond the "knee frequency" $1/(\pi\tau_r)$.

Preferably, in order to achieve this functionality without unduly consuming surface area of the circuit board, the ferrite bead-resistance combination is provided in a surface mount package, preferably a relatively small surface mount package. Although it is possible to provide the ferrite bead and the resistance as two discrete components within the surface mount package, in one embodiment, the ferrite bead is itself configured to have a desired low frequency resistance.

According to one aspect of the invention a ferrite bead is placed in series with a terminating resistor on a transmission line such as a clock transmission line. In lower frequency ranges where the ferrite bead is substantially not effective, the transmission line will be effectively terminated by the resistor. In higher frequency ranges where the resistor is substantially no longer effective, the transmission line will be terminated by the ferrite bead. In one aspect, the resistor and ferrite bead are provided in a single surface mount package.

BRIEF DESCRIPTION OF THE DRAWINGS

FIG. 1 is a schematic diagram depicting a source-terminated transmission line on a PCB according to previous devices;

FIG. 2 is a graph of typical clock pulses showing amplitude versus time;

FIG. 3 is a frequency-domain diagram of the spectrum of the clock waveform of FIG. 2;

FIG. 4 is a schematic diagram of an equivalent circuit for a surface mount resistor;

FIGS. 5A and 5B are diagrams of typical magnitudes of impedance as functions of frequency for a typical surface mount resistor are a typical ferrite bead, respectively;

FIG. 6A is a schematic diagram of an equivalent circuit for a transmission line terminator according to an embodiment of the present invention;

FIG. 6B is a perspective view of a PCB, partially broken away, including a transmission line with source termination according to an embodiment of the present invention, and FIG. 7 is a diagram of the equivalent frequency response of impedance for a transmission line terminator according to an embodiment of the present invention.

DETAILED DESCRIPTION

The present invention includes a recognition of the nature of certain problems in previous devices. Both ferrite beads and resistors have been used individually for various purposes. However, neither component, by itself, addresses the problems solved by the present invention, such as reducing unnecessary high-frequency currents on a transmission line (e.g. to avoid or reduce EMI) while preserving the waveform of signals (e.g. on a clock signal line or other type of transmission line).

Ferrite beads have been used in connection with controlling EMI e.g. by positioning ferrite beads on lines exiting the chassis, particularly adjacent to a chassis connector, e.g. to prevent high frequency currents going beyond the chassis by absorbing their magnetic fields and dissipating the energy as heat. However, a ferrite bead, by itself, has insufficient low-frequency impedance to operate effectively as a transmission line source terminator. Indeed, it is believed that, previously, ferrite beads were specifically designed to provide low frequency impedance which was as small as possible.

Certain types of transmission lines, e.g. as illustrated in FIG. 1, are provided with a resistor, such as a surface mount resistor 112 between a source 114 and a transmission line 116 leading to a load 118. This configuration may be suitable for certain types of transmission lines 116 in which there is, e.g. less concern with electromagnetic interference. In a configuration of FIG. 1, the resistor 112 is selected such that its resistance, plus the output impedance of the driver 114 is approximately equal to the characteristic impedance of the transmission line ($Z_0$) 116. A typical value the resistor 112 might be, e.g. about 33 ohms in connection with driving a 55 ohm transmission line 116.

FIG. 2 shows a typical, if somewhat idealized, clock pulse for transmission on a clock line, depicting the amplitude A as a function of time T. In the depicted embodiment, the clock pulse has a typical characteristic trapezoidal shape 212.

FIG. 3 depicts the frequency-domain spectrum 310 of the clock waveform of FIG. 2. For a pure, idealized resistor (with substantially no capacitance or inductance) the driving waveform (FIG. 2) is voltage-divided by the series-termination resistor 112 and the $Z_0$ of the transmission line 116 before it propagates down the line. A typical load is about 8 pF and 4 nH, caused by the package and silicon parasitics of the load. Under ideal conditions, the reflection coefficient at the end of the line, i.e. at the load 118, is +1 and, accordingly, the waveform doubles and reflects back towards the source 114. The termination resistor 112 (plus the source resistance) being equal to the $Z_0$ of the line 116, the waveform is dampened. The frequency 312, equal to $1/(\pi\tau_r)$ is the frequency below which most of the energy concentrates. For a rise/fall time of one nanosecond, frequency 312 corresponds to about 318 MHZ. In order to ensure that the waveform of the signal, such as the clock signal of FIG. 2, travels to the load 118 undistorted (and thus does not cause signal integrity violation such as excessive clock skew, threshold errors and the like), it is useful to ensure that the frequency response to the transmission line is relatively constant at frequencies less than the $1/(\pi\tau_r)$ frequency 312. In one embodiment, it is desired to provide a configuration in which the transmission line source terminator has substantially constant resistance between DC and about 1 GHz.

Unfortunately, resistors used in actual circuits can depart significantly from an idealized pure resistor. A typical surface mount resistor provides a certain amount of capacitance and inductance, with the equivalent circuit for a surface mount typical resistor being depicted in FIG. 4. A typical surface mount resistor provides an amount of inductance 412, generally considered lead inductance and an amount of capacitance 414 referred to as parasitic capacitance. This leads to behavior, in the frequency domain, illustrated (somewhat simplified) by the diagram of impedance 515 as a function of frequency, shown in FIG. 5. An isolated surface mount resistor typically is capable of terminating a transmission line in the range of frequencies where signal integrity is important, such as in the lower frequencies (below the knee frequency). Thus it is generally desirable to improve on a resistor, as a transmission line terminator, to address higher-frequency EMI concerns, without substantially degrading the type of lower-frequency signal integrity acheivable with a resistor. Without wishing to be bound by any theory, in general, at higher frequencies (beyond the knee frequency), the resistor no longer effectively blocks current from the driver, and no longer terminates effectivley terminates the transmission line as the reflected wave comes back toward the drivers (the reflection coefficient $\Gamma \ne 1$, resulting in reflection). The higher frequency currents are allowed to bounce back and forth on the transmission line, until they attenuate, resulting in EMI.

Accordingly, the behavior of an ideal resistor and, to an even greater degree, the behavior of an actual surface mount resistor, departs significantly from the desired substantially constant impedance between DC and about 1 GHz. Accordingly, while a surface mount resistor, in isolation, may be suitable as a line terminator for many purposes, when used in connection with a clock line or similar transmission line where it is important to avoid EMI (without sacrificing signal integrity or waveform integrity, which can otherwise result in excessive clock skew, threshold errors and the like), a surface mount resistor may be less than ideal.

FIG. 5B depicts the frequency domain impedance 514 (on a log-frequency scale) of one example of a ferrite bead. Although the frequency-domain behavior of various ferrite bead components differ, in general, as illustrated in FIG. 5B, a ferrite bead also typically fails to provide a substantially constant impedance between DC and 1 GHz.

According to an embodiment of the present invention, a transmission line such as a clock signal line or similar transmission line, is source-terminated by a combination of a resistor and a ferrite bead. A series-combination of a resistor and a ferrite bead is believed to correspond to equivalent circuits similar to that of FIG. 6A. In the configuration of FIG. 6A, the combination not only provides the lead inductance 612 and parasitic capacitance 614 associated with the resistor 616, but also inductance 618 arising at least from the ferrite bead. As shown in the frequency domain diagram of FIG. 7 (depicting impedance from the resistor 716, ferrite bead 718 and the ferrite bead-resistance combination 722 of the equivalent circuit of FIG. 6A), preferably the resistor and ferrite bead are selected substantially so that the high frequency impedance attributable to the ferrite bead 718 increases substantially in the same frequency region where the impedance of the resistor component begins to drop off 716. Accordingly, the impedance of the combination 722 avoids the type of rapid mid-frequency decrease in impedance shown in FIG. 5A. The frequency responses shown in FIG. 7 are intended to illustrate, generally the relative contributions of the resistor and ferrite bead, as a function of frequency. The actual frequency responses for particular embodiments of the present invention may differ from the illustration of FIG. 7. Without wishing to be bound by any theory, it is believed that this mid-frequency behavior of the combination, as depicted generally in FIG. 7, is largely responsible for preserving wave shapes and avoiding signal integrity violations of, e.g., clock signals on source terminated transmission lines using the present invention. In the frequency region where the impedance of the transmission line (as a function of frequency) should be constant (i.e. frequencies less than about $1/\pi\tau_r$) the impedance of the combined R-L is preferably designed to be equal to $Z_0-Z_{out}$ (driver impedance). In the region above the $1/\pi\tau_r$, the impedance of the combined R-L is preferably designed to be in the range of about 500 ohms to 750 ohms, preferably about 700 ohms, to dissipate high frequency currents believed to contribute to EMI.

In order to provide a resistor-ferrite bead device, as described, which is practical for use in modem electronic devices, it is particularly advantageous to provide the combination in a single surface-mount package, preferably in a relatively small package such as having a footprint of less than about 5 mm$^2$, preferably less than about 4 mm$^2$. Although, as noted above, ferrite beads typically have been fabricated so as to provide low frequency impedance which is as small as possible, in one embodiment the present invention is implemented by configuring a ferrite bead to provide a substantial low-frequency resistance (such as by fabricating a ferrite bead having a constricted region and/or doping with materials having less conductivity) so that a single device provides both the high frequency impedance function of a typical ferrite bead and the low frequency resistance features desired. Alternatively, a resistor and a ferrite bead can be provided as separate components and combined in series to form a transmission line source terminator, according to an embodiment of the present invention.

In light of the above discussion, a number of advantages of the present invention can be seen. The present invention is able to provide a transmission line terminator, such as a transmission line source terminator, which can reduce or avoid EMI while substantially preserving integrity of signals, such as clock signals and the like. The present invention provides for a generally improved transmission line source terminator in a relatively small component, preferably a surface mount component, such as providing a terminator with a width 632 less than about 1.5 mm and/or a length 634 less than about 2.5 mm and/or a footprint (length times width) less than about 5 mm$^2$. The present invention substantially avoids significant drops in impedance at frequencies below about $1/\pi\tau_r$, preferably at frequencies below about 1 GHz. The present invention provides for substantial impedance such as impedance of greater than about 500 ohms, at higher frequencies, such as frequencies greater than about 100 MHZ, e.g. for reducing or avoiding EMI. The present invention provides a generally improved transmission line source terminator in a fashion that is economical to design, fabricate, assemble and use.

A number of variations of modifications of the invention can be used. Although the invention has been described as being particularly useful in connection with clock signal lines, the invention can also be used in connection with other types of transmission lines, such as control lines and other series terminated transmission lines. It is possible to use some features of the invention without using others. For example, it is possible (although not necessarily economically desirable) to provide a transmission line terminator as described herein by providing a resistor and a ferrite bead in series, without providing the terminator as a surface mount package.

The present invention, in various embodiments, includes components, methods, processes, systems and/or apparatus substantially as depicted and described herein, including various embodiments, subcombinations, and subsets thereof. Those of skill in the art will understand how to make and use the present invention after understanding the present disclosure. The present invention, in various embodiments, includes providing devices and processes in the absence of items not depicted and/or described herein or in various embodiments hereof, including in the absence of such items as may have been used in previous devices or processes, e.g. for improving performance, achieving ease and\or reducing cost of implementation. The foregoing discussion of the invention has been presented for purposes of illustration and description. The foregoing is not intended to limit the invention to the form or forms disclosed herein. Although the description of the invention has included description of one or more embodiments and certain variations and modifications, other variations and modifications are within the scope of the invention, e.g. as may be within the skill and knowledge of those in the art, after understanding the present disclosure. It is intended to obtain rights which include alternative embodiments to the extent permitted, including alternate, interchangeable and/or equivalent structures, functions, ranges or steps to those claimed, whether or not such alternate, interchangeable and/or equivalent structures, functions, ranges or steps are disclosed herein, and without intending to publicly dedicate any patentable subject matter.

What is claimed is:

1. A source terminator device for a transmission line comprising:

a ferrite bead; and a resistance in series with said ferrite bead wherein said ferrite bead provides an impedance, above a knee frequency, greater than about a value of said resistance.

2. Apparatus as claimed in claim 1, wherein said ferrite bead and said resistance are provided in a surface mount package.

3. Apparatus as claimed in claim 2, wherein said surface mount package has a cross sectional footprint of less than about 5 mm$^2$.

4. A source terminator device for a transmission line comprising:

a ferrite bead; and a resistance in series with said ferrite bead;

wherein said resistance has a value of about 750 ohms.

5. A source terminator device for a transmission line comprising:

a ferrite bead; and a resistance in series with said ferrite bead wherein said resistance is integrally formed with said ferrite bead; and wherein said resistance is formed by a method selected from providing a constriction in said ferrite bead or doping said ferrite bead.

6. An electronic device apparatus having at least a first circuit board, said first circuit board including a clock signal transmission line for transmitting clock signal between a clock driver and a load, comprising:

a transmission line terminator between said source and said transmission line, said terminator including a series-connected resistor and ferrite bead wherein said ferrite bead provides an impedance, above a knee frequency, greater than about a value of said resistance.

7. A transmission line terminator for source termination comprising:

resistance means electrically coupled between said source and said transmission line; and ferrite bead means series-connected to said resistance means
wherein said resistance means has a value of about 750 Ohms.

8. A transmission line terminator for source termination comprising:
   resistance means electrically coupled between said source and said transmission line;
   ferrite bead means series-connected to said resistance means
   wherein said ferrite bead means provides an impedance above a knee frequency, greater than about a value of said resistance means.

9. Apparatus as claimed in claim 8, wherein said ferrite bead means and said resistance means are provided in a surface mount package.

10. Apparatus as claimed in claim 9, wherein said surface mount package has a cross sectional footprint of less than about 5 mm².

11. A transmission line terminator for source termination comprising:
   resistance means electrically coupled between said source and said transmission line;
   ferrite bead means series-connected to said resistance means
   wherein said resistance means is integrally formed with said ferrite bead means; and
   wherein said resistance means is formed by a method selected from providing a constriction in said ferrite bead or doping said ferrite bead.

12. An electronic device apparatus having at least a first circuit board, said first circuit board including a clock signal transmission line for transmitting clock signal between a clock driver and a load, comprising:
   a transmission line terminator between said source and said transmission line, said terminator including series-connected resistance means and ferrite bead means wherein said ferrite bead means is a means for providing an impedance, above a knee frequency, greater than about a value of said resistance.

13. A method for source-terminating of a clock signal transmission line comprising:
   forming a constriction in a ferrite bead for series-connecting a resistance and said ferrite bead to provide a line termination component;
   electrically coupling said termination component between said source and said transmission line;
   transmitting a sequential plurality of clock signals from said source, along said transmission line.

14. A method for source-terminating of a clock signal transmission line comprising:
   series-connecting a resistance and a ferrite bead which provides an impedance above a knee frequency, greater than about a value of said resistance means to provide a line termination component;
   electrically coupling said termination component between said source and said transmission line; and
   transmitting a sequential plurality of clock signals from said source along said transmission line.

15. A method as claimed in claim 14, further comprising providing said ferrite bead and said resistance in a surface mount package.

16. A method as claimed in claim 15, wherein said surface mount package has a cross sectional footprint of less than about 5 mm².

17. A method as claimed in claim 13, further comprising integrally forming said resistance with said ferrite bead.

18. A method, as claimed in claim 14 wherein said impedance above a knee frequency is between about 200 ohms and 1000 ohms.

19. A method, as claimed in claim 14 wherein said knee frequency is about 300 MHz.

20. A method for source-terminating of a clock signal transmission line comprising:
   series-connecting a resistance which has a value of about 750 ohms and a ferrite bead to provide a line termination component;
   electrically coupling said termination component between said source and said transmission line; and
   transmitting a sequential plural of clock signals from said source, along said transmission line.

* * * * *